US005483345A

United States Patent [19]
Donaher et al.

[11] Patent Number: 5,483,345
[45] Date of Patent: Jan. 9, 1996

[54] ALIGNMENT SYSTEM FOR USE IN LITHOGRAPHY UTILIZING A SPHERICAL REFLECTOR HAVING A CENTERED ETCHED-ON PROJECTION OBJECT

[75] Inventors: J. Casey Donaher, Westford; David S. Holbrook, Woburn; Shepard D. Johnson, Arlington; James A. Sozanski, Littleton, all of Mass.

[73] Assignee: MRS Technology, Inc., Chelmsford, Mass.

[21] Appl. No.: 300,649

[22] Filed: Sep. 6, 1994

[51] Int. Cl.$^6$ .................................................. G01B 11/00
[52] U.S. Cl. ........................................... 356/363; 356/401
[58] Field of Search ..................................... 356/400, 401, 356/363; 359/364, 726, 727, 730, 732, 738, 739

[56] References Cited

U.S. PATENT DOCUMENTS

| | | | |
|---|---|---|---|
| 4,232,969 | 11/1980 | Wilczynski | 356/401 |
| 4,390,279 | 6/1983 | Sawa | 356/363 |
| 4,778,275 | 10/1988 | van den Brink et al. | 356/401 |
| 5,031,976 | 7/1991 | Shafer | 359/727 |
| 5,100,237 | 3/1992 | Wittekoek et al. | 356/401 |

FOREIGN PATENT DOCUMENTS 1112846  3/1956  France .................................. 359/730

Primary Examiner—Frank Gonzalez
Assistant Examiner—Jason D. Eisenberg
Attorney, Agent, or Firm—Haynes N. Johnson

[57] ABSTRACT

A system for aligning substrates when preparing flat panel displays by lithography. A spherical reflector (imaging mirror) is used to focus a small geometric object, such as a cross, etched at the center of the reflector. The cross is projected toward a beam splitter and is then reflected onto the mirror which, in turn, images it on the surface of the substrate being used in the lithographic process. This optical system, which has a numerical aperture of about 0.05 radians, provides maximum depth of field with essentially no aberrations, and produces a relatively large probe image on a large alignment mark.

The surface of the substrate carries a grid of stepped patterns as an alignment mark. The steps diffract the light received, and the diffracted light passes through a lens system to a sensor associated with the lens system. The amount of light diffracted is dependent upon where the image strikes the steps in the grid. Thus, a correlation between position and the amount of light received by the sensor exists, and, so, the substrate can be precisely aligned.

16 Claims, 3 Drawing Sheets

ALIGNMENT SYSTEM FOR USE IN LITHOGRAPHY UTILIZING A SPHERICAL REFLECTOR HAVING A CENTERED ETCHED-ON PROJECTION OBJECT

FIELD OF THE INVENTION

This invention relates to the field of lithography and, in particular, to substrate alignment system incorporating a simple optical probe.

BACKGROUND OF THE INVENTION

Lithographic systems are used to project patterns onto a substrate resting on a stage. An example of such a system can be seen in Resor et al. U.S. Pat. No. 4,769,680 (U.S. Pat. No. Re. 33,836). The substrate carries a photosensitive coating which is developed and processed after exposure. The same substrate may go through this cycle several times until the desired number of patterned layers have been built up. Since many layers may be used, it is necessary to be able to position and align the substrate accurately before each exposure.

The primary attributes of such an alignment system are accuracy and precision. Typically, these attributes are degraded by several error sources:

Excessive aberrations in the alignment optics (especially asymmetric aberrations);

Focus sensitivity; focus walk; focus dependent aberrations;

Susceptibility to variations in substrate optical properties, such as reflectivity, resist thickness, and color;

Poor quality of alignment mark;

Sensitivity to stray light and flare;

Improper calibration;

Instability of alignment mechanics (long-term drift);

Noise.

Though the present invention senses light diffracted from an image, as does Wilczynski U.S. Pat. No. 4,232,969, Wilczynski projects its image through a hole in a mirror and uses the mirror to reflect the diffracted light, rather than detecting it along the optical axis. The mirror slows down the lithographic process since it has to be moved out of the way after each alignment step.

BRIEF SUMMARY OF THE INVENTION

Our invention uses a simple optical probe to project two orthogonal slit images onto the substrate to be aligned. Our probe has a low numerical aperture to take advantage of the fact that large alignment marks can be used in flat panel display lithography.

The substrate has previously been patterned with a relatively large periodic structure serving as an alignment mark. As this structured pattern is scanned in a direction perpendicular to one of the slit images, a periodic signal of light will be diffracted from it. This signal is collected using annular collection optics and relayed to a photodetector. The output of the photodetector is analyzed and the functional relationship between the signal received and the substrate position can be used to accurately align the substrate.

Due to the alignment methods used in flat panel display ("FPD") lithography, alignment mark areas of several square millimeters each are practical (as contrasted to wafer lithography for making chips). The use of large marks allows several benefits: A larger alignment mark creates a larger return signal by providing more structure to diffract light. It also averages over a greater region, reducing the effect of localized irregularities and defects. More room in the alignment region allows coarser features to be used. This has the two-fold effect of making the mark less sensitive to resist processing and allows a lower numerical aperture ("NA") optical probe to be used.

Therefore, a simple low numerical aperture optical system consisting of a cross object, a beamsplitter, and a spherical mirror is used to project a low resolution (15–20 μm) probe mark onto the alignment mark. This embodiment has the benefit of symmetric, exceptionally small, design aberrations with a large depth of focus. Since the probe is used as an AC detector, it is relatively insensitive to the flare produced by the unused, diverging light passing through the beamsplitter. The annular collection optics is a simple and efficient method to direct signals of all orientations to the same detector.

DETAILED DESCRIPTION OF THE INVENTION

Figure 1:
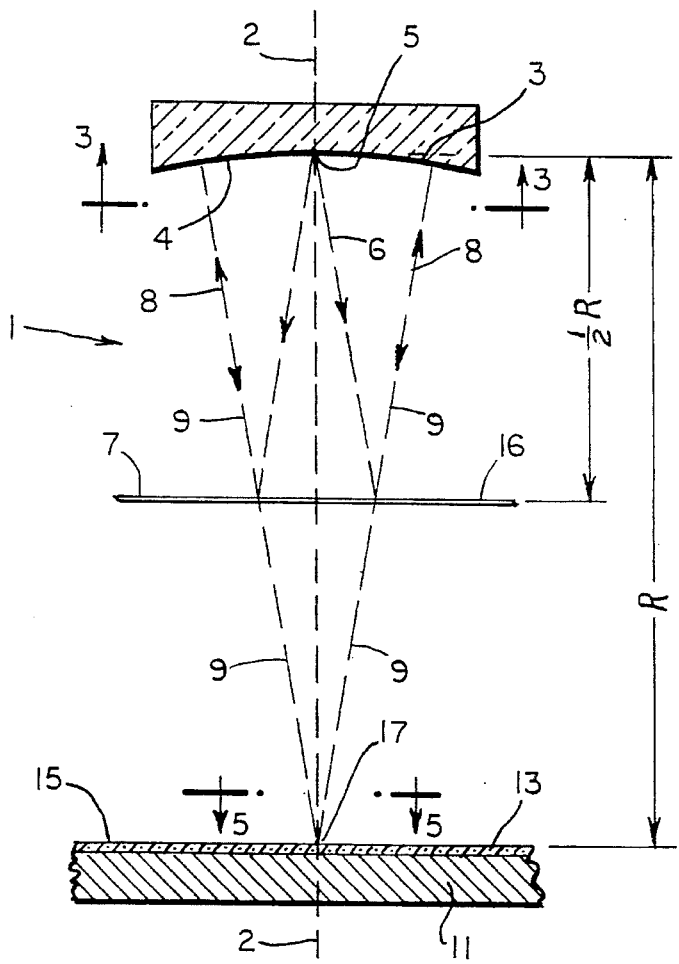
FIGS. 1 and 2 show two forms of spherical reflector systems which can be used with our invention.
Figure 2:
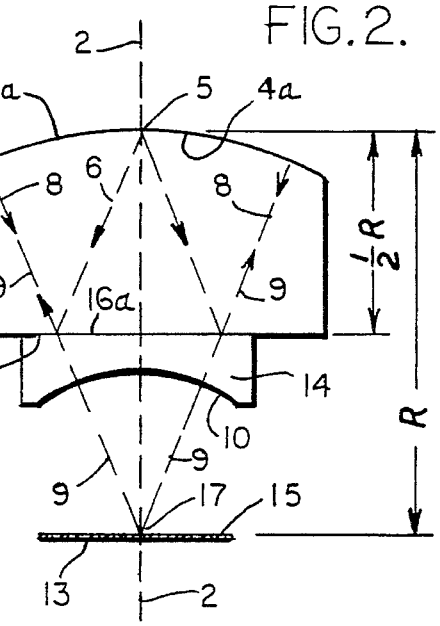

The concept of using a spherical reflector system to project an image is shown in FIGS. 1 and 2. In FIG. 1, a reflector system 1 includes a glass reflector 3 having an upper surface which is planar and transverse to the optical axis. (FIGS. 1 and 2 do not include the necessary, source of light, detector, and lens system directing return light to the detector; see FIG. 4 for these). The lower side of reflector 3 is a spherical reflective surface 4.

Figure 3:
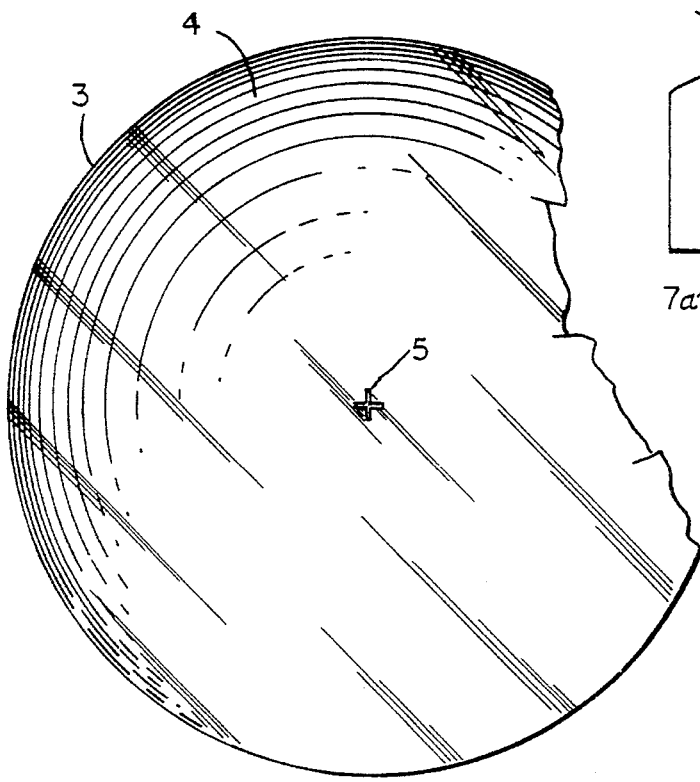
FIG. 3 is a section taken on line 3—3 of FIG. 1. It is a bottom plan view of the lens, showing the cross which is projected to the substrate.
Figure 7:
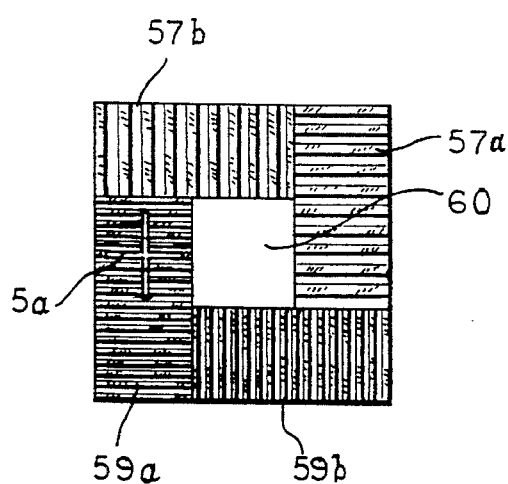
FIG. 7 is a plan view of a sample grid with the cross projected on it as the grid is scanned.
Figure 8:
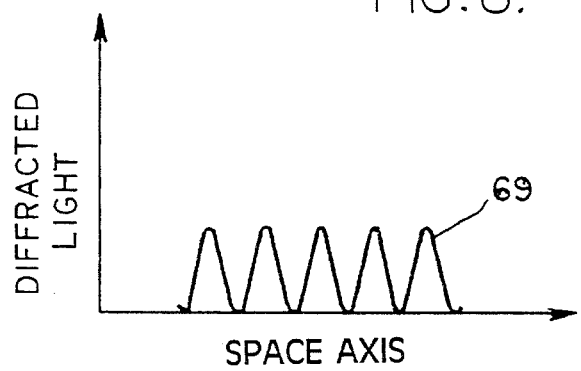
FIG. 8 is a curve showing the intensity of the diffracted light received by the sensor as the grid is scanned under the cross.

The object 5 to be reflected, preferably a symmetrical cross (FIGS. 3 and 7), is at the center of reflective surface 4 on its optical axis 2. This object can be etched in surface 4 or, with the structures of FIGS. 2 and 4, could be in a reticle held close to the reflective surface of reflector 3.

The approximate spacing is as follows: The radius of curvature of surface 4 is the distance from the center of surface 4 (at object 5) to the image point 17 on image plane 15, adjusted to accommodate the thickness of beam splitter 7. The upper surface 16 of beam splitter 7 is at a distance from the center of surface 4 equal to half that radius. It is also the same distance optically from image plane 15.

FIG. 2 shows a modification of FIG. 1. Here the glass reflector 3a has its upper surface as the spherical reflective surface 4a, and its lower surface 7a as the planar surface acting as a beam splitter. Spherical surface 4a has a radius equal to the distance to image 17; lower surface 7a is spaced a distance from object 5 equal to half the radius. This lower surface 7a has an abutting lens 14 which, itself has a lower spherical surface 10. Surface 10 has a radius equal to its distance to image 17 and, therefore, has no power in this system.

The object 5 is etched in the center of spherical surface 4a on the optical axis 3 of the spherical surface. In FIG. 2, beams 6 from the object 5 go to beam splitter 7a and are reflected from inner surface 16a (on the bottom of reflector 3a) as beams 8 to the inner surface of glass reflector 3a. They are then reflected back as beams 9 to form the image 17.

Figure 4:
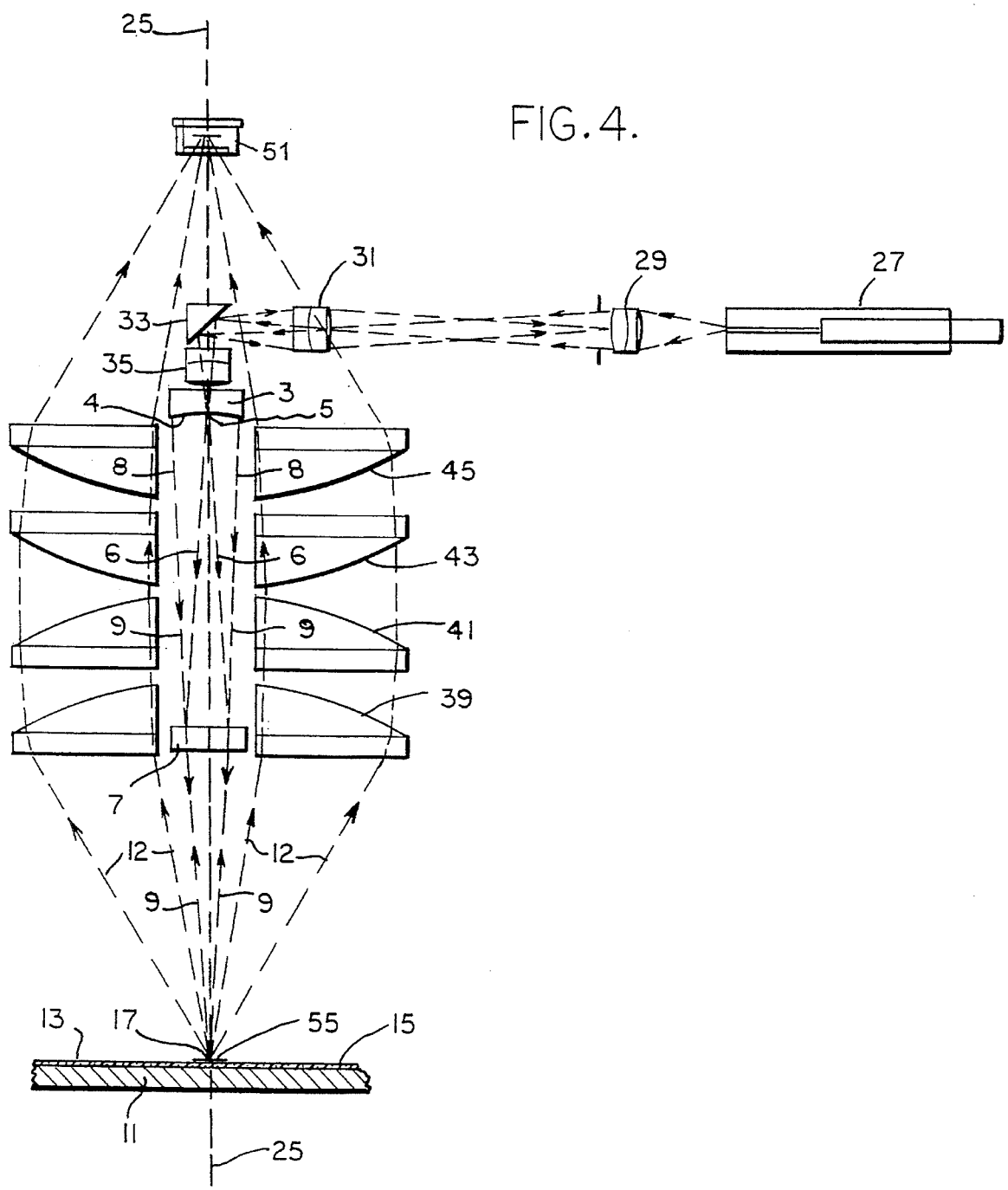
FIG. 4 is a diagram of our preferred optical system.

In operating the structures of FIGS. 1 and 2, light is directed at reflector 3 or 3a from above (as in FIG. 4). Beams 6 from the object 5 pass to beam splitter 7 or 7a (transverse to optical axis 4) and are reflected back as beams 8 from the various points on the upper surface 16 of beam splitter 7 or 7a to spherical reflective surface 4. Beams 8 are then reflected from the surface 4 as beams 9, and pass through the beam splitter and come to a focus at image 17. Image 17 is on image plane 15, which is the upper surface of a glass substrate 13 resting on stage 11.

FIG. 4 shows a complete optical system utilizing the concept of spherical lenses. It is patterned after FIG. 1. The object 5 is centered in the lower spherical surface 4 of glass reflector 3 as an etched mark positioned on the optical axis 25 of spherical surface 4. Beams 6 from this object pass to beam splitter 7 and are reflected back as beams 8 to spherical surface 4, and are again reflected as focussed beams 9 to form image 17.

As in FIG. 1, glass reflector 3 in FIG. 4 has a planar upper surface and a lower reflective spherical surface with a radius equal to the optical distance to image 17. The upper surface of beam splitter 7 is planar, is transverse to the optical axis, and is a distance from object 5 equal to approximately one half of the radius.

Object 5 is illuminated by fiber optic light source or light pipe 27, the light from which passes through lenses 29 and 31, to folding mirror 33, and thence through focussing lens 35 to the object on surface 4. The light beams travel and are reflected as beams 6, 8, and 9, as described above with reference to FIGS. 1 and 2. A detector 51 is positioned on the optical axis above the folding mirror to receive light diffracted from a grating pattern or grid 55 which has been printed in substrate 13. The detector may be a silicon detector or a photomultiplier tube. Lower collection lenses 39 and 41, and upper collection lenses 43 and 45, are used to collect the light and direct it to detector 51. These lenses have central openings to permit them to be positioned annularly about reflector 3, beam splitter 7, and focussing lens 35 and fold mirror 33. These openings also allow passage of the beams 6, 8, and 9. The two lower lenses 39 and 41 have planar lower surfaces and spherical upper surfaces such that their combined power largely collimates the diffracted light from grid 55. The two upper lenses 43 and 45 have planar upper surfaces and spherical lower surfaces with radii such that their combined power focuses the light exiting lenses 39 and 41 to detector 51. Thus, a substantial portion of the light reflected by image 17 as detector beam 12 will be directed to the detector 51. Alternatively, an asphere, a Fresnel lens, or an holographic optical element (HOE) can be substituted for lenses 39 and 41, and a second one for lenses 43 and 45.

The entire unit can be secured to and carried by the principal lens system of the lithographic system itself.

The optical system has a low numerical aperture ("NA"). By low numerical aperture we mean an aperture of about 0.05 radians, measuring the angle from the optical axis to the edge of the aperture (The full angle subtending the aperture would be 0.1 radians). This compares with an NA of about 0.25 used in the prior wafer art. The smaller aperture gives far greater depth of field, enhancing accuracy for non-flat substrates. It is also smaller in size, allowing more space for annular collection lenses, and, so, greater light collection.

The low NA, however, means that the brightness of the image is less, since the brightness is proportional to $(NA)^2$. This would normally mean one must use a more sensitive, more expensive detector. However, when making flat panel displays (in contrast to wafers) there is room for a larger alignment mark, which produces more diffracted light. We use a probe image measuring about 1×1 mm. We refer to a probe image of this size as a large probe image, and prefer not to use smaller sizes. We refer to an alignment mark of about 5×5 mm as a large alignment mark, and prefer not to use smaller sizes. By using these large sizes, we obtain larger return signals, reduce error, and can use smaller numerical apertures.

In order for position to be determined accurately, an alignment mark or grating 55 (FIGS. 4, 5 and 6) has been formed on the photosensitive coating of substrate 13 (this would be done on the occasion of the exposure of this first coating). This grating will provide a basis for aligning this substrate properly for exposure of subsequent coatings. The grating may be made up of four sections 57a, 57b, 59a, and 59b forming the periphery of a square, with a square, unused area 60 in the center. Each of the gratings has a series of evenly spaced steps or teeth 61 parallel to one another. Two of the gratings 57a and 57b are orthogonal to one another and have steps 61 of the same pitch. The other two gratings 59a and 59b are orthogonal to one another and have steps of equal pitch, but a slightly different pitch than that of the first two gratings. To give an idea of dimension, in this instance square 55 can be 5.4 mm on a side, with each of the gratings measuring 2.2 mm by 3.2 mm, the central opening would be 1 mm square. The steps of the gratings and the spaces between them may be equal. Gratings 57a and 57b could have a pitch of 71.2 µm; and gratings 59a and 59b could have a pitch of 72.0 µm. Alternatively, as another example the central opening can be omitted, and four square gratings, each measuring 3×3 mm, used, providing an alignment mark measuring 6×6 mm.

Figure 5:
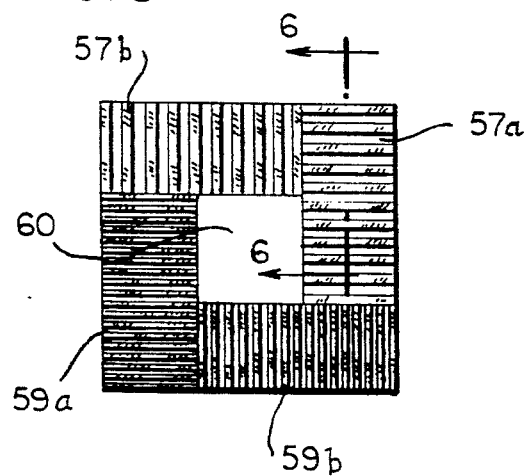
FIG. 5 is top plan view of an example patterned grid, used for alignment, taken on line 5—5 of FIG. 1.
Figure 6:
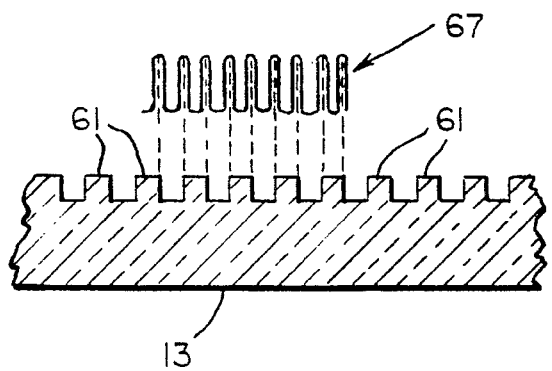
FIG. 6 is a section taken on line 6—6 of FIG. 5 showing schematically how the light is diffracted back from the grid.

The projected alignment image 17 consists of two superimposed slits, one parallel to the X axis of the stepper, and one parallel to the Y axis. This gives the mark the form of a cross. The alignment marks 55 on the substrate consist of two sets of gratings 57a, 57b, 59a, and 59b, one parallel to the X axis of the stepper and one parallel to the Y axis. (These marks are not superimposed, but placed side by side, as shown in FIG. 5).

A signal corresponding to the physical characteristics of the substrate, and to the imaging characteristics of the projected alignment cross, can be developed by scanning the alignment mark grating 55 under the projected cross 17. Light diffracted by the alignment marks etched on the substrate is collected by lenses 39, 41, 43, and 45, and directed to the photo-detector 51. The photo-detector converts the light falling on it into an electrical current, which is amplified and ultimately digitized. The photo-signal thus produced is recorded as a function of substrate position in X and Y. The signals from each pair of parallel gratings are digitally superimposed, producing a vernier-like peak at the point where alignment is achieved.

In order to be used for alignment purposes, a grating must have a well defined relationship to the rest of the patterning imagery on the original artwork (reticle). In other words, the grating consists of a periodic function of known spatial frequency (pitch) and phase, in the coordinate system that defines the artwork.

When patterned onto the substrate, and scanned under the alignment sensor, such a grating will produce a periodic signal 67 (in the coordinate system of the substrate). This signal will have essentially the same spatial frequency as the frequency 61 of the substrate alignment grating 55, but with an arbitrary phase. The position of the grating, and thus of the patterning imagery (in the coordinate system of the substrate) is implicit in this measured phase.

Phase offsets of more than two PI (one grating pitch) cannot be resolved with certainty. To extend the useful capture range of the alignment sensor, gratings of two slightly different frequencies have been used. Both gratings are scanned, and solved for their respective phases. The difference between the two phases advances far more slowly than the phase of each grating (e.g., the phase difference between a 71.2 μm grating and a 72 μm grating advances from 0 to 2 PI every 6.408 mm).

In this way, measuring the phase differences of the two gratings with slightly different pitch allows a coarse alignment to within one pitch. Alignment to within a small fraction of one pitch can then be made by processing the signal of one of the gratings.

Two gratings in X, and two in Y, are required to solve for the X-Y position of each alignment site on the substrate. A plurality of alignment marks, spaced apart, permits the determination of θ.

We claim:

1. An alignment system for use in lithography, said system including a spherical reflector of low numerical aperture having an optical axis, said spherical reflector having a radius, a center, and a convex side, said spherical reflector having an image plane, an object at said center of said reflector and on said optical axis, means for projecting said object, a beam splitter transverse to said optical axis and positioned at a distance of one-half of said radius from said object to reflect said projected object to said spherical reflector, a substrate positioned in said optical axis, said substrate being in said image plane of said spherical reflector, said substrate carrying an alignment mark, whereby an image of said projected object is projected on said alignment mark on said substrate in said image plane for alignment.

2. An alignment system as set forth in claim 1 in which the numerical aperture is equal to or less than substantially 0.05 radians.

3. An alignment system as set forth in claim 1 in which said means for projecting an object includes illumination means on said convex side of said reflector to direct light at said object.

4. An alignment system as set forth in claim 1 in which said alignment mark is a stepped grating on said substrate, whereby an image of said projected object in said image plane will be diffracted, producing diffracted light.

5. An alignment system as set forth in claim 4 including a detector producing an output signal functionally related to said diffracted light received by said detector, and an optical system positioned to receive said diffracted light and project it to said detector, whereby said output signal is used to determine the position of said substrate.

6. An alignment system as set forth in claim 5 in which said detector is on said optical axis and said optical system annularly surrounds said optical axis and said spherical reflector.

7. An alignment system as set forth in claim 4 in which said stepped grating is formed of two orthogonally positioned pairs of parallel steps, each of said pairs having first and second members, the steps in said first member of each said pair being of a different pitch than the steps in said second member of each said pair, whereby said diffracted light from each set of steps, considered individually, provides fine measurement resolution; and said diffracted light from both sets of steps, considered together, provides large capture range.

8. An alignment system as set forth in claim 1 in which said spherical reflector is made of glass and said spherical reflector is a concave surface of said glass.

9. An alignment system as set forth in claim 8 in which said object is etched on said concave surface.

10. An alignment system as set forth in claim 1 in which said spherical reflector and said beam splitter are formed as an integral unit.

11. A system for aligning a substrate for lithographic projection to make a flat panel display, said system including a stage for holding a substrate to be exposed, said substrate having an upper surface, said upper surface of said substrate being an image plane, a projection system including a glass spherical reflector with an optical axis and a radius, said reflector having a surface and a convex side, said projection system having a numerical aperture of substantially 0.05 radians, an object to be projected formed on said surface of said spherical reflector on said optical axis, said object being transmissive, and illumination means positioned to illuminate said object from said convex side of said spherical reflector, a beam splitter transverse to said optical axis and positioned one-half said radius away from said object, said beam splitter being positioned to reflect said illuminated object back to said spherical reflector, and said image plane being transverse to said optical axis at an optical distance of said radius from said reflector, whereby an image of said object will be formed on said image plane.

12. A system as set forth in claim 11 in which said upper surface of said substrate carries an alignment mark, and including a detector in said optical axis and an associated optical system positioned to collect light diffracted from said alignment mark and provide an output signal functionally related to said collected light.

13. A system as set forth in claim 12 in which said optical system is annularly positioned about said spherical reflector.

14. A system as set forth in claim 11 in which said upper surface includes an alignment mark formed as a stepped grating to receive said projected image and produce diffracted light which varies in amount in accordance with the position of said projected image on said grating.

15. A system as set forth in claim 14 in which said alignment mark is about 5×5 mm.

16. A system as set forth in claim 11 in which the object to be projected is etched on said spherical reflector.

* * * * *

UNITED STATES PATENT AND TRADEMARK OFFICE
CERTIFICATE OF CORRECTION

| | | |
|---|---|---|
| PATENT NO. | : | 5,483,345 |
| DATED | : | January 9, 1996 |
| INVENTOR(S) | : | J. Casey Donaher, David S. Holbrook, Shepard D. Johnson and James A. Sozanski |

It is certified that error appears in the above-identified patent and that said Letters Patent is hereby corrected as shown below:

Col. 1, before "Field of Invention", insert the following:

--GOVERNMENT FUNDING
    This invention was made with Government support under
Contract No. F33615-92-C-5805 awarded by the United States Air Force.
The Government has certain rights in the invention.--

Signed and Sealed this

Ninth Day of June, 1998

Attest:

BRUCE LEHMAN

*Attesting Officer*     *Commissioner of Patents and Trademarks*